United States Patent [19]
Narita et al.

[11] Patent Number: 5,936,283
[45] Date of Patent: Aug. 10, 1999

[54] MOSFET FOR INPUT/OUTPUT PROTECTIVE CIRCUIT HAVING A MULTI-LAYERED CONTACT STRUCTURE WITH MULTIPLE CONTACT HOLES ON A SINGLE DIFFUSION LAYER

[75] Inventors: Kaoru Narita; Takeo Fujii, both of Tokyo, Japan

[73] Assignee: NEC Corporation, Tokyo, Japan

[21] Appl. No.: 08/906,336

[22] Filed: Aug. 5, 1997

[30] Foreign Application Priority Data

Aug. 5, 1996 [JP] Japan ................................. 8-205612

[51] Int. Cl.$^6$ .................................................. H01L 23/48
[52] U.S. Cl. .......................... 257/355; 257/324; 257/342; 257/343; 257/358; 257/363; 257/382; 257/384; 257/396; 257/459
[58] Field of Search ........................ 257/324, 342, 257/343, 382–384, 459, 486, 271, 341, 355, 358, 359, 360, 363, 396, 503, 700, 748; 438/233, 622, 652

[56] References Cited

U.S. PATENT DOCUMENTS

| | | | |
|---|---|---|---|
| 5,264,729 | 11/1993 | Rostoker et al. ........................ | 257/700 |
| 5,338,975 | 8/1994 | Cole, Jr. et al. ........................ | 257/700 |
| 5,631,495 | 5/1997 | Dunn et al. .............................. | 257/587 |
| 5,689,133 | 11/1997 | Li et al. .................................. | 257/361 |

FOREIGN PATENT DOCUMENTS

| | | |
|---|---|---|
| 61-248445 | 11/1986 | Japan . |
| 63-76473 | 4/1988 | Japan . |
| 3-248567 | 11/1991 | Japan . |
| 5-41493 | 2/1993 | Japan . |

*Primary Examiner*—Fetsum Abraham
*Attorney, Agent, or Firm*—Sughrue, Mion, Zinn, Macpeak & Seas, PLLC

[57] ABSTRACT

According to the present invention, a MOSFET for an input/output protective circuit in which a source diffusion layer, a drain diffusion layer and a gate electrode are formed on a semiconductor substrate comprises a high melting point metal silicide layer disposed on the drain diffusion layer through a first insulating film, a metal wire layer disposed on the high melting point metal silicide layer through a second insulating film, at least two first contact holes for electrically connecting the high melting point metal silicide layer and the metal wire layer, and a second contact hole for electrically connecting the high melting point metal silicide layer and the drain diffusion layer, wherein the second contact hole is disposed at a substantial center between the two first contact holes.

10 Claims, 5 Drawing Sheets

5,936,283

MOSFET FOR INPUT/OUTPUT PROTECTIVE CIRCUIT HAVING A MULTI-LAYERED CONTACT STRUCTURE WITH MULTIPLE CONTACT HOLES ON A SINGLE DIFFUSION LAYER

BACKGROUND OF THE INVENTION

1. Field of the Invention

The present invention relates to a MOSFET for an input/output protective circuit. More specifically, the present invention relates to a structure of a MOSFET in which a level of electrostatic resistance is increased.

2. Description of the Related Art

In a semiconductor integrated circuit, when an overvoltage is applied to an input/output terminal, a protective circuit is disposed in the input/output terminal so that an internal circuit may not be broken. Many protective circuits include a protective MOSFET. The protective circuit in which the protective MOSFET is used will be described below.

FIG. 1(a) shows an example that the protective MOSFET is used for protecting an input. A drain electrode is connected to an input terminal directly or through a resistance r. A gate electrode and a source electrode are commonly connected to a ground power source. Typically, this NMOSFET is in a state of a discontinuity, since a gate potential is fixed at a ground level. A signal applied to the input terminal is supplied to the internal circuit as it is. When the overvoltage such as an electrostatic pulse is applied to the input terminal, a parasitic NPN bipolar transistor which is formed by a drain-substrate-source of the protective NMOSFET is conducted. The parasitic NPN bipolar transistor is operated so that the overvoltage may not be supplied to the internal circuit.

FIG. 1(b) shows an example that the protective MOSFET is used for protecting an output. The drain electrode is connected to the input terminal. The source electrode is connected to the ground power source. An output signal of the internal circuit is supplied to the gate electrode. This NMOSFET combines an output transistor and a protective transistor. When the overvoltage is applied to an output terminal, the NMOSFET is in a state of a continuity. A charge is emitted to a ground terminal.

FIG. 1(c) shows an example that a CMOS circuit is used as the output transistor. Like the circuit shown in FIG. 1(b), when the overvoltage is applied to the output terminal, the NMOSFET is conducted, and thus this circuit functions as the protective transistor.

An exemplary structure of the above-described protective NMOSFET will be described with reference to FIGS. 2 and 3.

Herein, an exemplary input protective N-type MOSFET is described in which the gate potential is fixed at the ground level. In FIG. 2, a polysilicon wire (701) is connected to an external terminal. The polysilicon wire (701) is connected to a drain diffusion layer (707) of the protective MOSFET by an embedded contact hole (704). Furthermore, a metal wire 2 (703) is a wire for transmitting the signal to the internal circuit to be protected.

Typically, since the gate potential is fixed at the ground level, this NMOSFET is not conducted and is not operated. Accordingly, the signal from the external terminal is input from the polysilicon wire through the drain diffusion layer (707) of the MOSFET via the metal wire 2 to the internal circuit. When the overvoltage such as the electrostatic pulse is applied to the external terminal, the parasitic NPN bipolar transistor which is formed by the drain (707)-substrate (820)-source (708) of the protective NMOSFET is conducted. A voltage between the external terminal and a ground is clamped, which prevents the overvoltage from being applied to the internal circuit.

During a parasitic bipolar operation, a high electric field is generated near a junction of the drain diffusion layer of the NMOSFET. A high current flows, and thus a temperature is increased. If an embedded contact is not used, the metal wire is connected directly to the drain diffusion layer. Therefore, a heat causes the metal wire at a contact portion to be melted. The melted metal wire reacts with a silicon substrate. A metal wire 1 and the substrate are short-circuited. The embedded contact is used for a reason that the metal wire is spaced from the drain diffusion layer so as to prevent the metal wire from easily melting, which allows a level of electrostatic resistance to be improved.

In a conventional semiconductor device as shown in FIGS. 2 and 3, one embedded contact hole (704) alone is disposed between the polysilicon wire (701) and the drain diffusion layer (707). In addition, the embedded contact hole (704) is located at an end of the drain diffusion layer (707). Thus, the following problem occurs.

A process in which the MOSFET is operated as the described-above parasitic NPN bipolar transistor is accomplished in the following manner according to an investigation by the inventors.

In the first place, a surge voltage applied to the external terminal is transmitted from the polysilicon wire (701) to the drain diffusion layer (707). A breakdown occurs at any one point where the surge voltage comes in contact with the drain diffusion layer and a gate electrode (706).

In general, the breakdown occurs at the end of a field LOCOS which has the lowest junction pressure resistance, for example, at a portion shown by X in FIG. 2. Thenceforth, with a substrate current generated by the breakdown, the parasitic bipolar operation is performed. Initially, the operation is started near a point X. The operation is subsequently transmitted in a direction W of a MOS transistor and is spread. For example, when the MOS transistor has W=50 $\mu$m, it is appreciated that it takes 20–40 nsec until the parasitic bipolar operation is performed all over the entire W.

Accordingly, in a very initial step of the parasitic bipolar operation, the current is restrained to some extent. A current density is restrained at the point where the breakdown occurs. After the current is thoroughly spread, the inventor of the present invention found that a connecting method is preferable which allows a current distribution to be uniform.

In this point of view, in the structure shown in FIG. 2, a stress is increased at the point X. Therefore, a junction deterioration causes a generation of a leakage current. In many cases, a gate insulating film is broken.

BRIEF SUMMARY OF THE INVENTION

Objects of the Invention

Accordingly, it is an object of the present invention to provide a MOSFET for a protective circuit which has a structure where a level of electrostatic resistance is increased.

Summary of the Invention

According to the present invention, a MOSFET for an input/output protective circuit in which a source diffusion layer, a drain diffusion layer and a gate electrode are formed on a semiconductor substrate comprises a high melting point metal silicide layer disposed on the drain diffusion layer through a first insulating film, a metal wire layer disposed on the high melting point metal silicide layer through a second insulating film, at least two first contact holes for electrically connecting the high melting point metal silicide layer and the metal wire layer, and a second contact hole for electrically connecting the high melting point metal silicide layer and the drain diffusion layer, wherein the second contact hole is disposed at a substantial center between the two first contact holes.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1A:
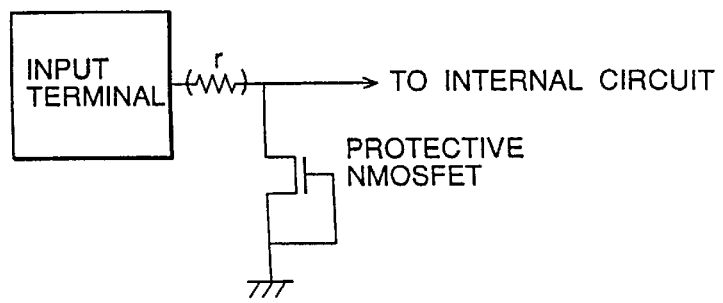
FIGS. 1(*a*)–(*c*) are circuit diagrams showing an exemplary electrostatic protective circuit, respectively.
Figure 1B:
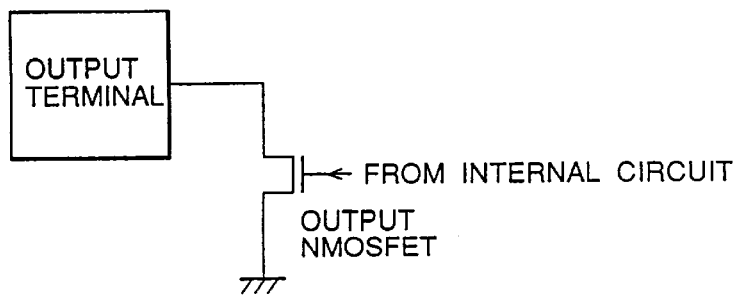
Figure 1C:
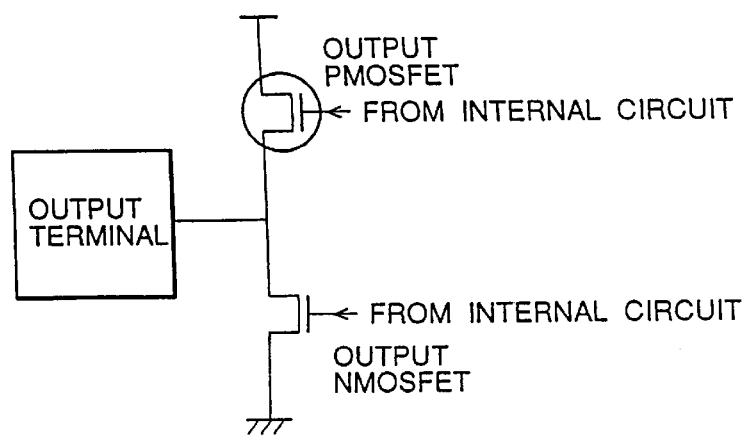
Figure 2:
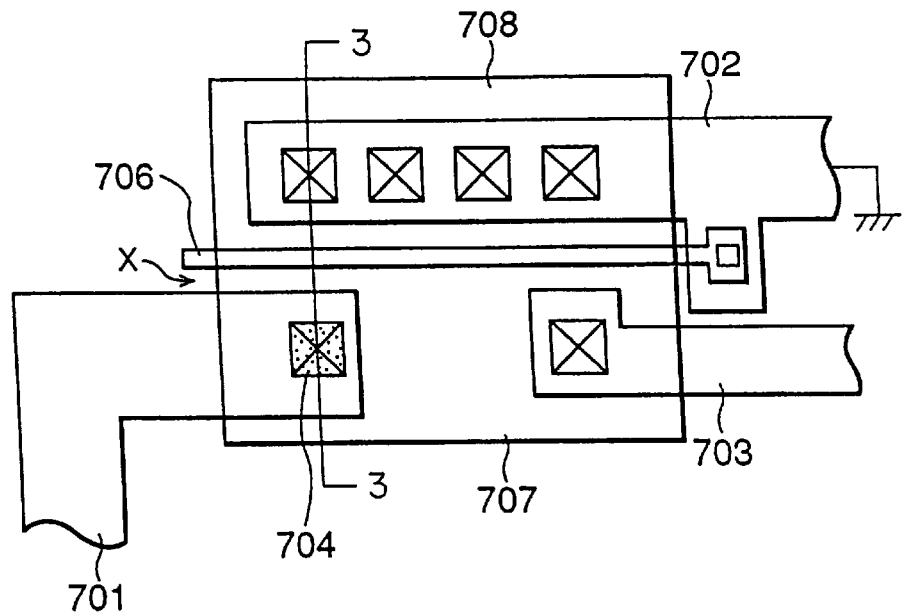
FIG. 2 is a plan view of a MOSFET for use in a conventional electrostatic protective circuit.
Figure 3:
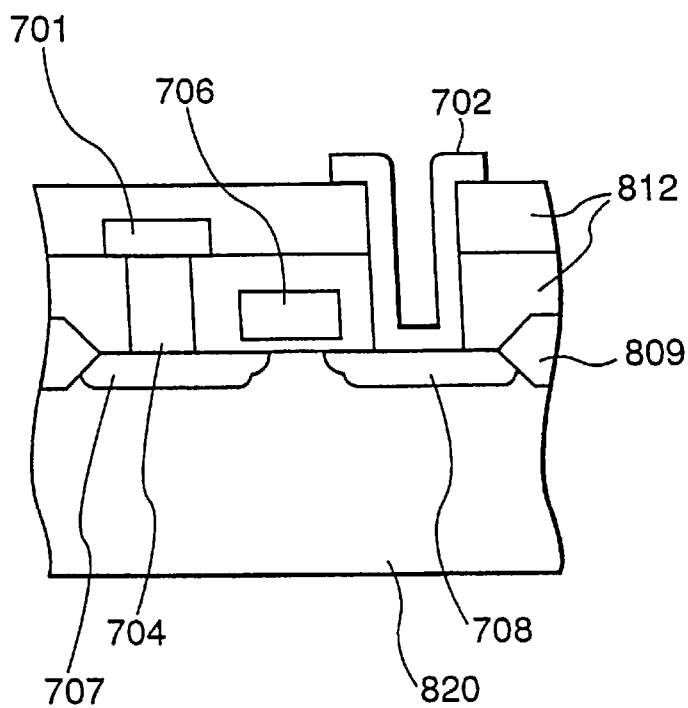
FIG. 3 is a cross sectional view taken on line a-a' of FIG. 2.

The present invention is applicable to all NMOSFETs shown in FIGS. 1(*a*)–1(*c*).

Figure 4:
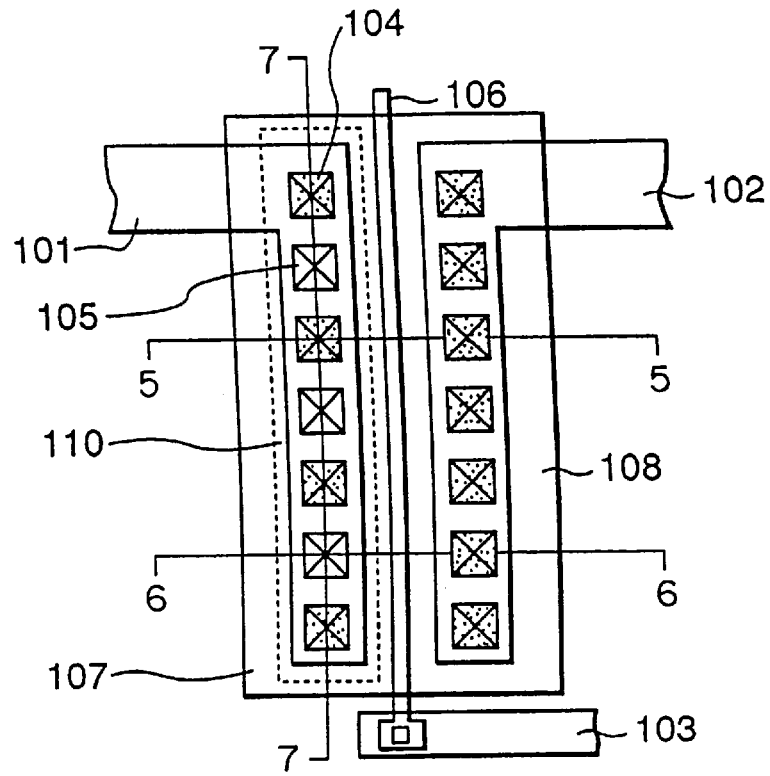
FIG. 4 is a plan view of the MOSFET showing an embodiment of the present invention.

When the present invention is applied to a circuit of FIG. 1(*a*), an input terminal and an internal wire are connected to a metal wire 1 (101) shown in FIG. 4. A metal wire 2 (102) and a metal wire 3 (103) are fixed to a ground potential. When the present invention is applied to the circuits of FIGS. 1(*b*) and 1(*c*), the metal wire 1 (101) shown in FIG. 4 is connected to an output terminal. The metal wire 2 (102) is fixed to the ground potential. The metal wire 3 (103) is connected to an internal circuit. That is, even if the present invention is applied to either circuit, a location where the metal wire is to be connected is solely changed. A structure of a MOSFET is not changed.

Next, a first embodiment of the present invention of the present invention will be described with reference to FIGS. 4–7.

Figure 5:
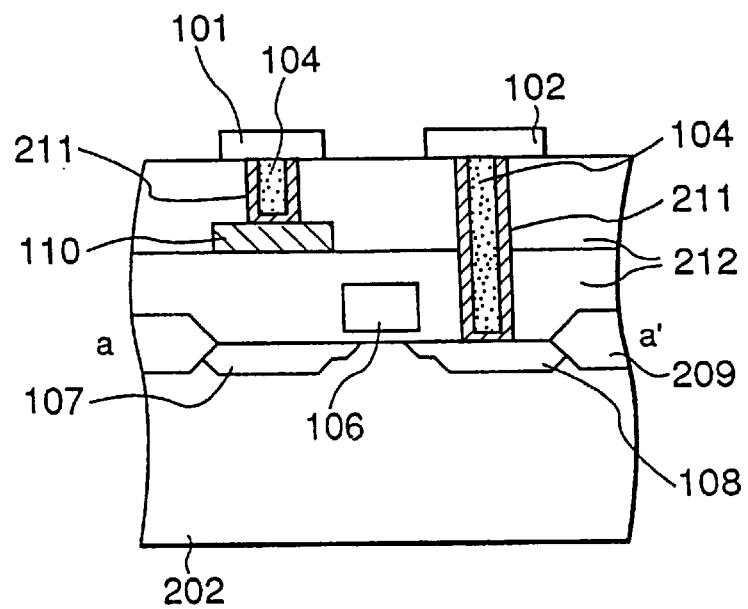
FIG. 5 is a cross sectional view taken on line a-a' of FIG. 4.
Figure 6:
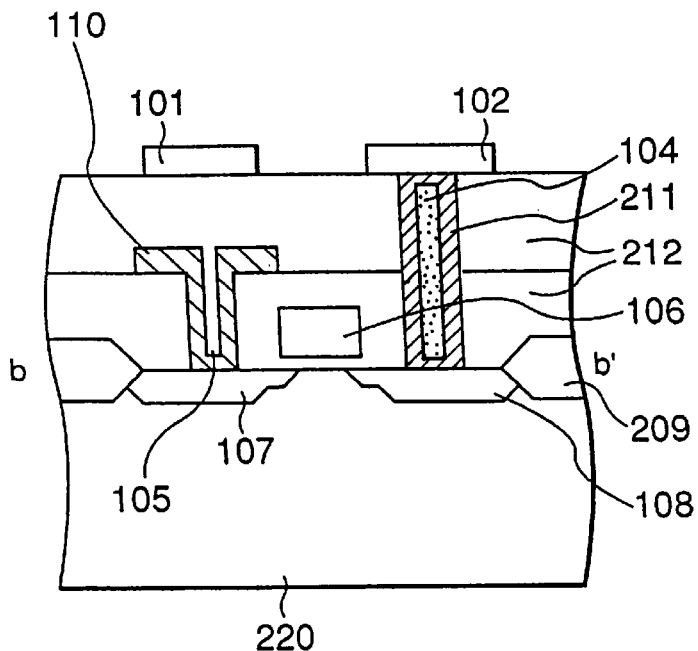
FIG. 6 is a cross sectional view taken on line b-b' of FIG. 4.

In FIG. 4, the metal wire 1 (101) (where, an aluminum wire) is connected to an input/output terminal and a source diffusion layer (108) directly or through a resistance. The metal wire 2 (102) is fixed to the ground potential. As shown in FIG. 5, a tungsten silicide wire layer (110) which is composed of a high melting point silicide layer is disposed on an interlaminar insulating film (212) on a drain diffusion layer (107). The metal wire 1 is connected to the tungsten silicide wire layer by a plurality of first contact holes (104). As shown in FIG. 6, the tungsten silicide wire layer is connected to the drain diffusion layer by a plurality of second contact holes (105). A tungsten embedded layer is disposed in the first contact holes (104). A barrier metal layer (211) is disposed in a lower layer so as to electrically connect the metal wire 1 (101) and the tungsten silicide wire layer (110). The barrier metal layer (211) is a two-layer structure in which a titanium and a titanium nitride form a lower layer and an upper layer, respectively. The tungsten silicide layer is disposed in the second contact holes (105) so as to electrically connect the tungsten silicide wire layer (110) and the drain diffusion layer (107).

Figure 7:
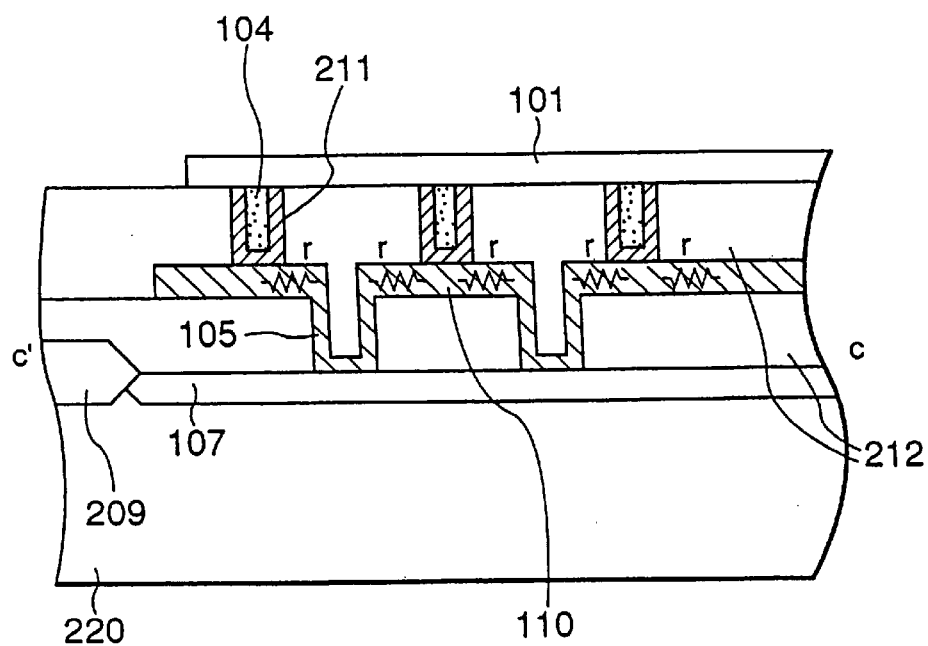
FIG. 7 is a cross sectional view taken on line c-c' of FIG. 4.

As clearly shown in FIGS. 4 and 7, the first contact holes and the second contact-holes are alternately formed. The metal wire 1 (101) is connected to the drain diffusion layer (107) through a resistance r of the tungsten silicide wire layer (110).

In this structure, even if an application of an overvoltage to the input/output terminal causes the MOSFET to be conducted by a parasitic bipolar operation whereby a temperature of a drain junction is increased, it is the high melting point tungsten silicide layer (110) that is connected directly to the drain diffusion layer (107). The contact is not readily melted. In addition, since the resistance r of the tungsten silicide wire layer is connected in series from the metal wire to the drain diffusion layer, this resistance permits a discharge current flowing during the application of the overvoltage to be limited. Accordingly, the electrostatic pressure resistance is further improved. At this time, since all the distances between the first and second contact holes are equal so that the resistance r may be uniform, the partial resistance r alone is reduced. Thus, the discharge current does not concentrate on the partial resistance r.

Figure 8:
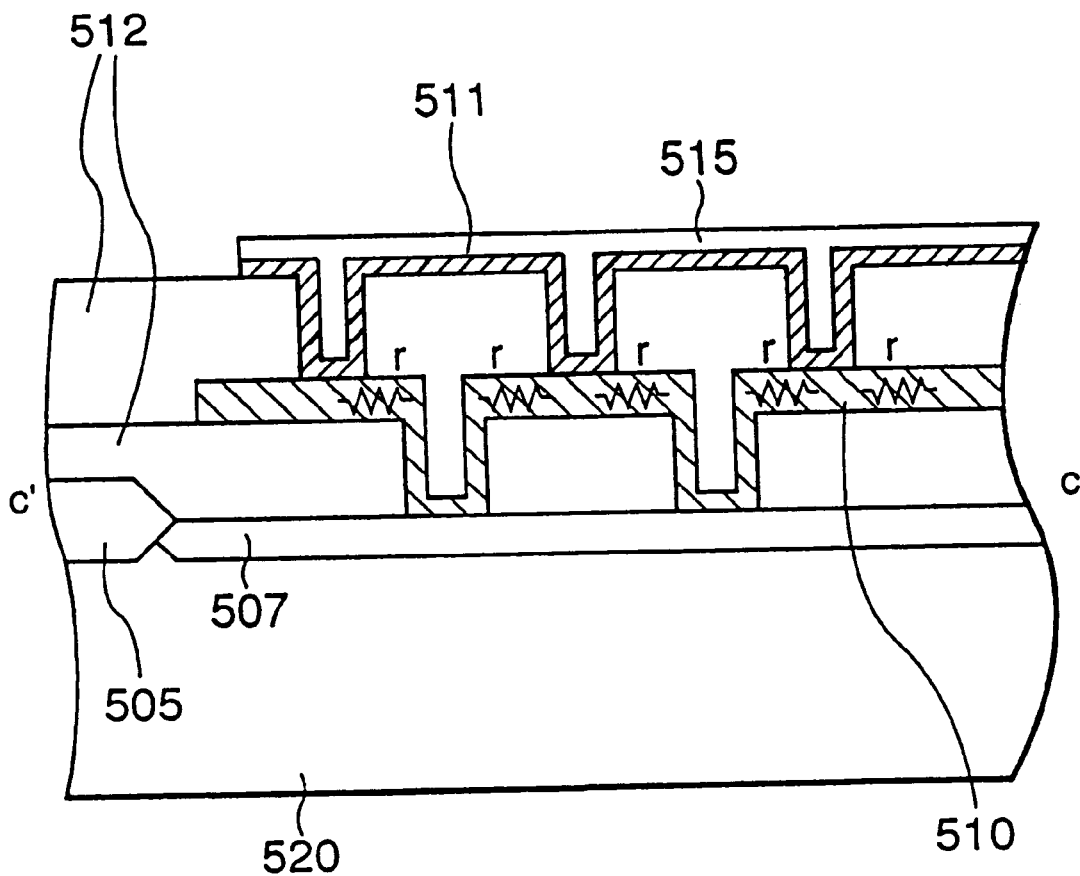
FIG. 8 is a cross sectional view for illustrating another embodiment of the present invention.

In FIG. 8, there is shown an example that the same tungsten as a material of the embedded contact hole is used for a metal wire (515) so as to reduce a manufacturing process. In this case, after a formation of a barrier metal layer (511) composed of the titanium and the titanium nitride, the contact hole is embedded. At the same time, the tungsten is excessively grown, thereby permitting a wiring.

According to the present invention, in the initial step of the parasitic bipolar operation, a local current is flowed. Therefore, a substantial series resistance r contributes so as to restrain a current density. When an entire MOS transistor starts the bipolar operation, the resistance is connected in parallel. The resistance r/n contributes. Sufficient clamp properties can be achieved. Furthermore, a uniform current distribution can be obtained. A break of a protective element itself can be avoided.

Although the invention has been described with reference to specific embodiments, this description is not met to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A MOSFET for an input/output protective circuit in which a diffusion layer, a drain diffusion layer and a gate electrode are formed on a semiconductor substrate, said MOSFET further comprising:

a first insulating film with a first contact hole formed therein and formed on the substrate;

a second insulating layer with a second contact hole and a third contact hole formed therein and formed above said insulating film;

a high melting point metal silicide layer disposed on an upper surface of said first insulating film, said high melting point silicide layer being in electrical contact with said drain diffusion layer through the first contact hole formed in the first insulating film;

a metal wire layer disposed on said second insulating film, said metal wire layer being in electrical contact with said high melting point metal silicide layer which is formed on said upper surface of the first insulating film through the second and third contact holes formed in the second insulating film;

wherein said first contact hole formed in said first insulating film is disposed at a substantial center between said second and third contact holes formed in said second insulating film.

2. The MOSFET for an input/output protective circuit according to claim 1, wherein said metal wire layer is connected to an external terminal.

3. The MOSFET for an input/output protective circuit according to claim 1, wherein a high melting point metal and a barrier metal layer are embedded in said second and third contact holes to electrically connect the metal wire layer with said high melting point silicide layer and, a high melting point metal silicide is disposed in said first contact hole to electrically connect said high melting point silicide layer with said drain diffusion layer.

4. A MOSFET for an input/output protective circuit in which a source diffusion layer, a drain diffusion layer and a gate electrode are formed on a semiconductor substrate, comprising:

a first insulating film disposed on said drain diffusion layer;

a first contact hole, formed by one part of said first insulating film being removed, and thereby said drain diffusion layer being exposed;

a high melting point metal silicide layer disposed on said first insulating film, at a bottom and on a side of said first contact hole;

a second insulating film disposed on said high melting point metal silicide layer;

two second contact holes, formed by two parts of said second insulating film being removed, and thereby said high melting point metal silicide layer being exposed;

an embedded metal layer embedded in said two second contact holes; and a metal wire layer disposed on said second insulating film and electrically connected to said embedded metal layer, wherein two portions of said high melting point metal silicide layer are exposed from said two second contact holes, a length from one exposed portion to said high melting point metal silicide layer at the bottom of said first contact hole is substantially equal to that from the other exposed portion to said high melting point metal silicide layer at the bottom of said first contact hole.

5. The MOSFET for an input/output protective circuit according to claim 4, wherein said embedded metal layer includes a high melting point metal and a barrier metal layer.

6. A MOSFET for an input/output protective circuit in which a source diffusion layer, a drain diffusion layer and a gate electrode are formed on a semiconductor substrate, said MOSFET comprising:

a first insulating film disposed on said drain diffusion layer;

a plurality of first contact holes, formed by parts of said first insulating film being removed, and thereby said drain diffusion layer being exposed;

a continuous high melting point metal silicide layer disposed on an upper surface of said first insulating film, at the bottom and on the side of said plurality of first contact holes;

a second insulating film disposed on said high melting point metal silicide layer;

a plurality of second contact holes, formed by parts of said second insulating film being removed, and thereby said high melting point metal silicide layer being exposed a plurality of embedded metal layers embedded in said plurality of second contact holes to be in electrical contact with said high melting point silicide layer; and a metal wire layer disposed on said second insulating film and electrically connected to said plurality of embedded metal layers, said embedded metal layers providing electrical contact between said metal wire layer and said high melting point silicide layer, wherein said plurality of first contact holes and said plurality of second contact hole are disposed so that they are alternately connected to said high metal point metal silicide layer, and respective distances between said first and second contact holes are substantially equal to one another.

7. A semiconductor device comprising:

a diffusion layer formed in a semiconductor substrate;

a first insulating film formed on said diffusion layer;

a plurality of first contact holes selectively formed in said first insulating film to expose a plurality of parts of said diffusion layer, respectively;

a first layer serving as a resistor and being disposed on an upper surface of said first insulating film in contact with the respective parts of said diffusion layer through said first contact holes;

a second insulating film formed on said first layer;

at least one second contact hole selectively formed in said second insulating film to expose at least one part of said first layer which is formed on the upper surface of said first insulating film; and a conductive layer formed on said second insulating film in contact with said part of said first layer through said second contact hole.

8. The semiconductor device according to claim 7, wherein said second contact hole is positioned in plane view between adjacent ones of said first contact holes.

9. The semiconductor device according to claim 7, wherein said first layer comprises a high melting point metal silicide layer.

10. The semiconductor device according to claim 9, wherein said first layer further comprises a barrier metal which is inserted between said high melting point metal silicide layer and said part of said first layer.

* * * * *